United States Patent
Tanihira et al.

(10) Patent No.: US 12,369,338 B2
(45) Date of Patent: Jul. 22, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kei Tanihira, Himeji Hyogo (JP); Yoichi Hori, Himeji Hyogo (JP); Hiroshi Kono, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 516 days.

(21) Appl. No.: 17/881,089

(22) Filed: Aug. 4, 2022

(65) Prior Publication Data

US 2023/0299211 A1    Sep. 21, 2023

(30) Foreign Application Priority Data

Mar. 16, 2022    (JP) .................................. 2022-041425

(51) Int. Cl.
H10D 8/60     (2025.01)
H10D 62/10    (2025.01)
H10D 62/17    (2025.01)

(52) U.S. Cl.
CPC ............. *H10D 8/60* (2025.01); *H10D 62/106* (2025.01); *H10D 62/393* (2025.01)

(58) Field of Classification Search
CPC ...... H10D 8/60; H10D 62/393; H10D 62/126; H10D 62/10; H10D 62/106;
(Continued)

(56) References Cited

U.S. PATENT DOCUMENTS 7,508,045 B2    3/2009 Nishio et al.
9,887,285 B1*   2/2018 Oota .................. H10D 62/8325
(Continued)

FOREIGN PATENT DOCUMENTS

JP    2008-172008 A    7/2008
JP    2021190573 A    12/2021
(Continued)

OTHER PUBLICATIONS

Notice of Reasons for Refusal (Office Action) dated Mar. 28, 2025 in corresponding Japanese Patent Application No. 2022-041425 with English machine translation (6 pages).

*Primary Examiner* — Mouloucoulaye Inoussa
(74) *Attorney, Agent, or Firm* — Kim & Stewart LLP

(57) ABSTRACT

A semiconductor device includes a first electrode, a first semiconductor layer, a second semiconductor layer, a third semiconductor layer, a fourth semiconductor layer, a fifth semiconductor layer, and a second electrode. The fourth semiconductor layer is located in a second region on the first semiconductor layer. The fourth semiconductor layer is separated from the second semiconductor layer with a portion of the first semiconductor layer interposed. An impurity concentration of the fourth semiconductor layer is greater than an impurity concentration of the first semiconductor layer and less than an impurity concentration of the second semiconductor layer.

12 Claims, 8 Drawing Sheets

(58) Field of Classification Search
CPC ............ H10D 62/8325; H10D 62/105; H10D 62/109; H10D 62/108; H10D 84/146; H10D 62/157; H10D 62/364; H10D 62/107; H10D 84/144; H10D 62/127; H10D 84/811; H10D 12/031
See application file for complete search history.

(56) References Cited

U.S. PATENT DOCUMENTS

| | | | |
|---|---|---|---|
| 2008/0211020 A1* | 9/2008 | Saito | H10D 30/665 |
| | | | 257/342 |
| 2012/0326207 A1* | 12/2012 | Yoshimochi | H10D 62/116 |
| | | | 257/E29.198 |
| 2013/0140584 A1 | 6/2013 | Kameshiro et al. | |
| 2016/0260829 A1* | 9/2016 | Aichinger | H10D 30/668 |
| 2019/0088648 A1* | 3/2019 | Hori | H10D 62/108 |
| 2019/0341447 A1* | 11/2019 | Siemieniec | H10D 30/668 |
| 2020/0091295 A1* | 3/2020 | Ohashi | H10D 62/393 |
| 2020/0091298 A1 | 3/2020 | Hori | |
| 2021/0013339 A1* | 1/2021 | Okumura | H10D 62/8325 |
| 2021/0305435 A1* | 9/2021 | Hori | H10D 62/126 |
| 2021/0343835 A1* | 11/2021 | Siemieniec | H10D 62/8325 |
| 2021/0376168 A1* | 12/2021 | Tanihira | H10D 8/60 |

FOREIGN PATENT DOCUMENTS

| | | |
|---|---|---|
| WO | 2011/151901 A1 | 12/2011 |
| WO | 2014/038225 A1 | 3/2014 |

* cited by examiner

SEMICONDUCTOR DEVICE

CROSS-REFERENCE TO RELATED APPLICATIONS

This application is based upon and claims the benefit of priority from Japanese Patent Application No. 2022-041425, filed on Mar. 16, 2022; the entire contents of which are incorporated herein by reference.

FIELD

Embodiments relate to a semiconductor device.

BACKGROUND

A Schottky barrier diode (SBD) realizes a diode by forming a junction between a metal and an n-type semiconductor and by utilizing the work function difference between the metal and the n-type semiconductor. To suppress leakage current, a junction barrier Schottky (JBS) structure also has been proposed, in which a p-type layer is located in a portion of the semiconductor at the junction surface with the metal, so that a depletion layer is formed with the p-n interface as a starting point when reverse-biased, thereby moving the position of the maximum electric field strength toward the semiconductor side from the junction interface between the metal and the semiconductor. It is desirable for such a semiconductor device to be more resistant to surge current.

DETAILED DESCRIPTION

In general, according to one embodiment, a semiconductor device includes a first electrode, a first semiconductor layer, a second semiconductor layer, a third semiconductor layer, a fourth semiconductor layer, a fifth semiconductor layer, and a second electrode. The first semiconductor layer is connected to the first electrode. The first semiconductor layer is of a first conductivity type. The second semiconductor layer is located in a first region on the first semiconductor layer. The second semiconductor layer is of the first conductivity type. An impurity concentration of the second semiconductor layer is greater than an impurity concentration of the first semiconductor layer. The third semiconductor layer is located on the second semiconductor layer. The third semiconductor layer is of a second conductivity type. The fourth semiconductor layer is located in a second region on the first semiconductor layer. The fourth semiconductor layer is separated from the second semiconductor layer with a portion of the first semiconductor layer interposed. The fourth semiconductor layer is of the first conductivity type. An impurity concentration of the fourth semiconductor layer is greater than the impurity concentration of the first semiconductor layer and less than the impurity concentration of the second semiconductor layer. The fifth semiconductor layer is located on a portion of the fourth semiconductor layer. The fifth semiconductor layer is of the second conductivity type. The second electrode is connected to the third, fourth, and fifth semiconductor layers.

An embodiment of the invention will now be described.

Figure 1:
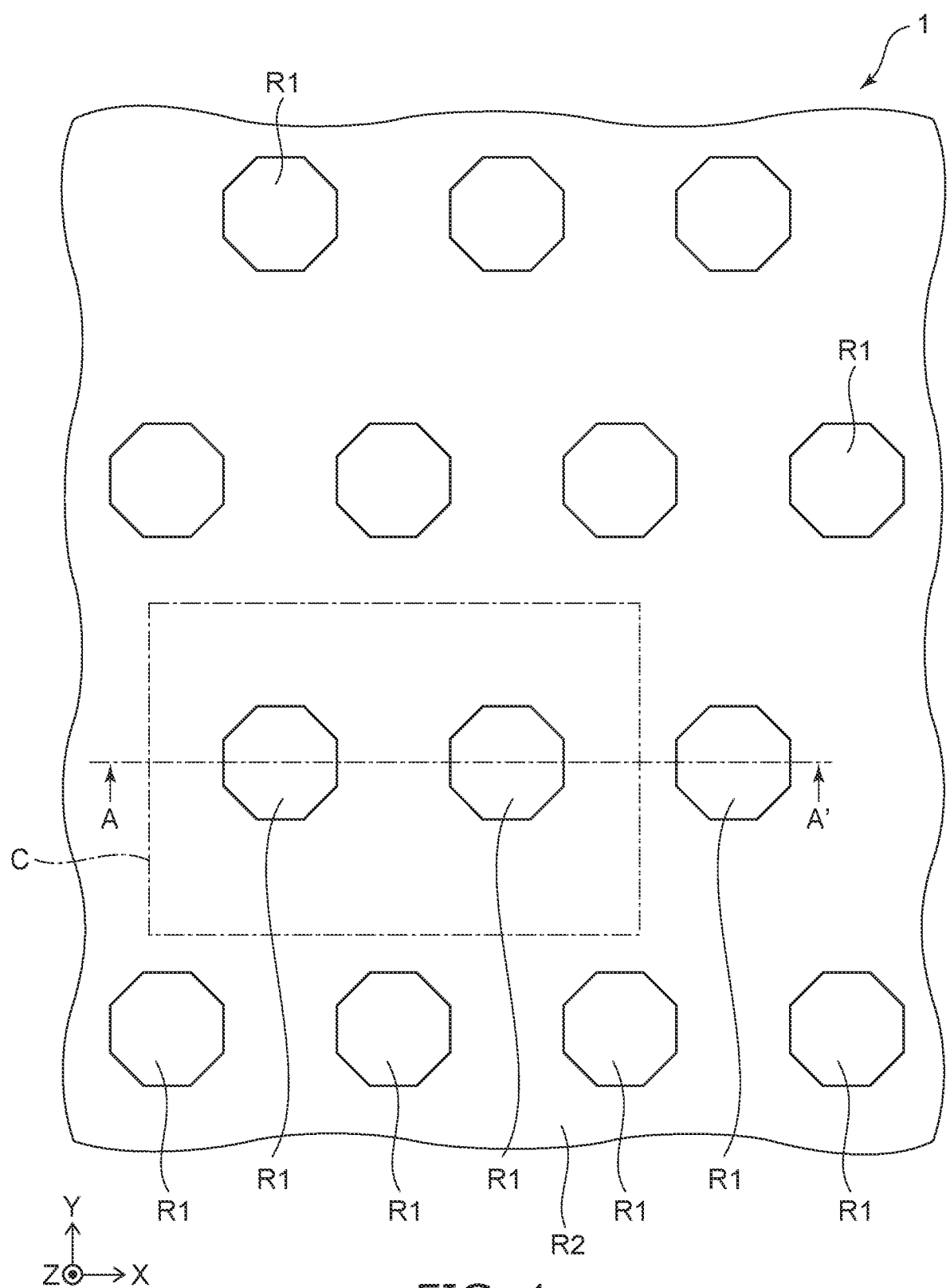
FIG. 1 is a plan view showing a semiconductor device according to an embodiment.

FIG. 1 is a plan view showing a semiconductor device according to the embodiment.

Figure 2:
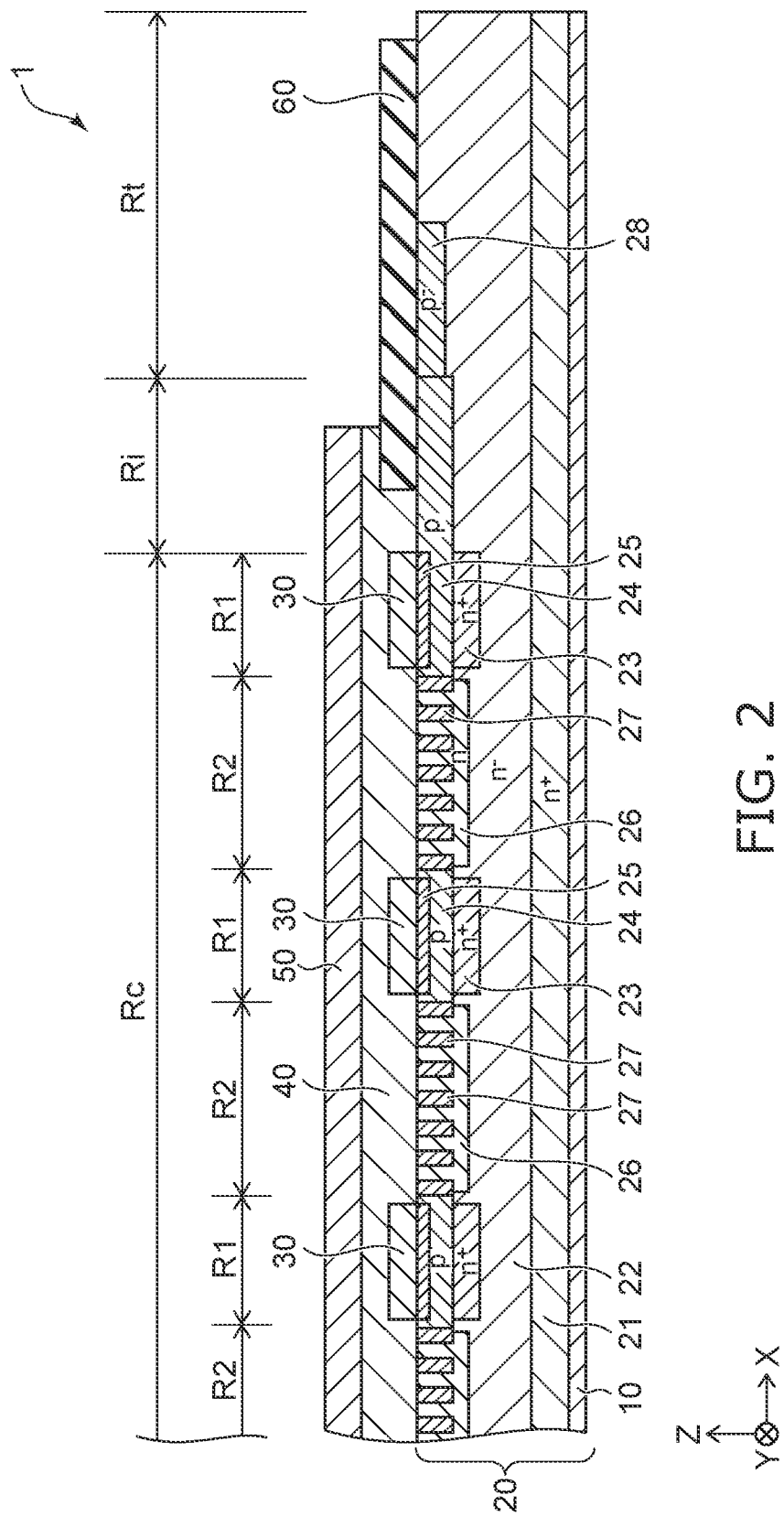
FIG. 2 is a cross-sectional view showing the semiconductor device according to the embodiment.

FIG. 2 is a cross-sectional view showing the semiconductor device according to the embodiment.

Figure 3A:
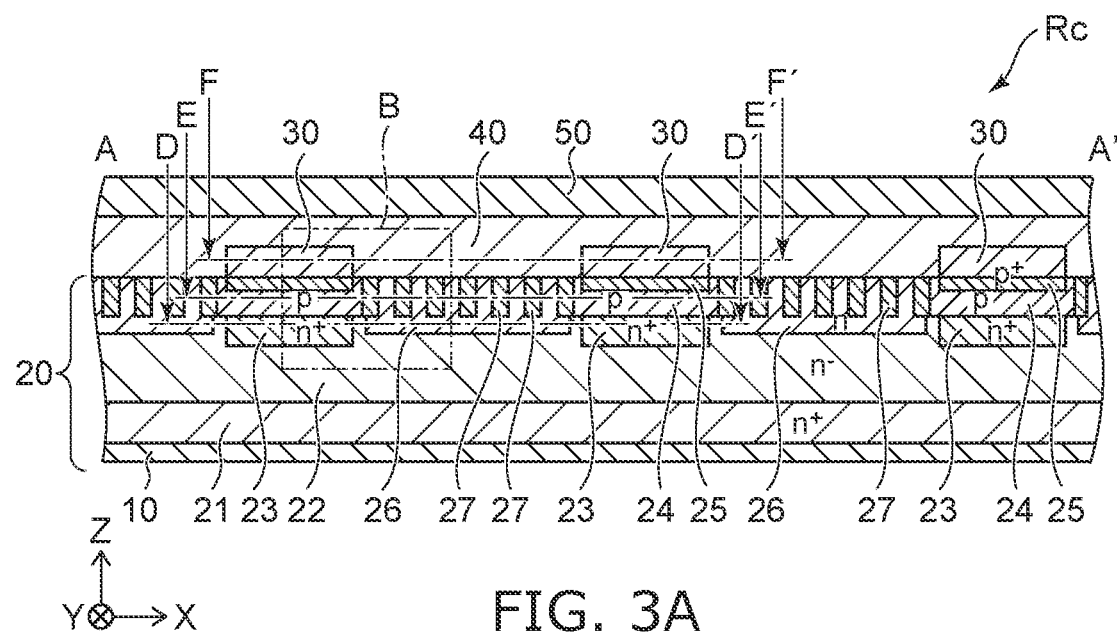
FIG. 3A is a cross-sectional view along line A-A' shown in FIG. 1.
Figure 3B:
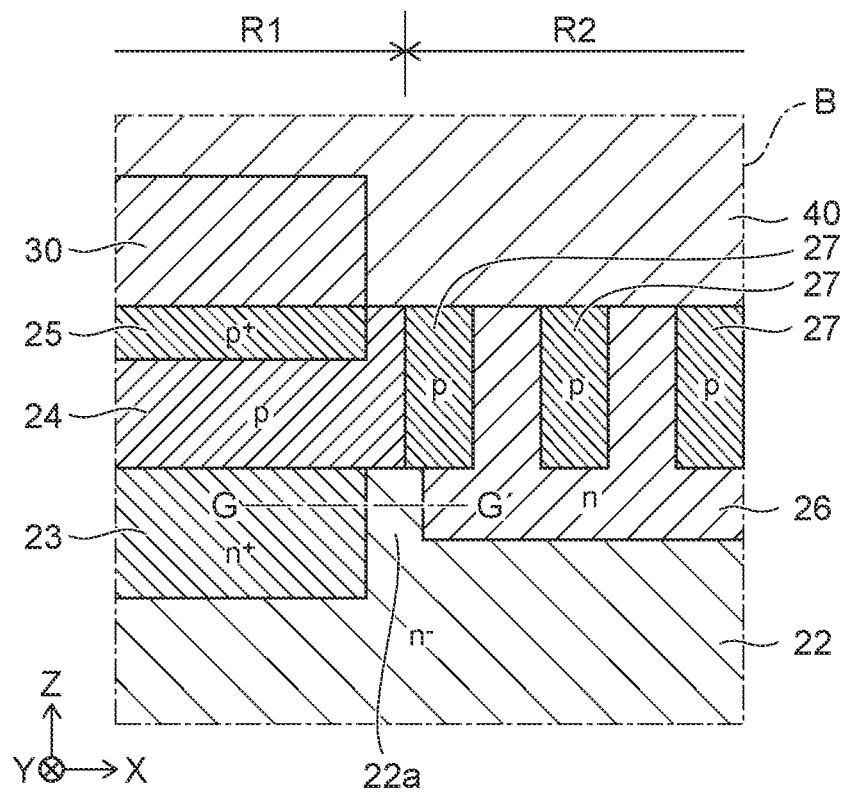
FIG. 3B is a partially enlarged cross-sectional view showing a region B of FIG. 3A.

FIG. 3A is a cross-sectional view along line A-A' shown in FIG. 1; and FIG. 3B is a partially enlarged cross-sectional view showing region B of FIG. 3A.

Figure 4:
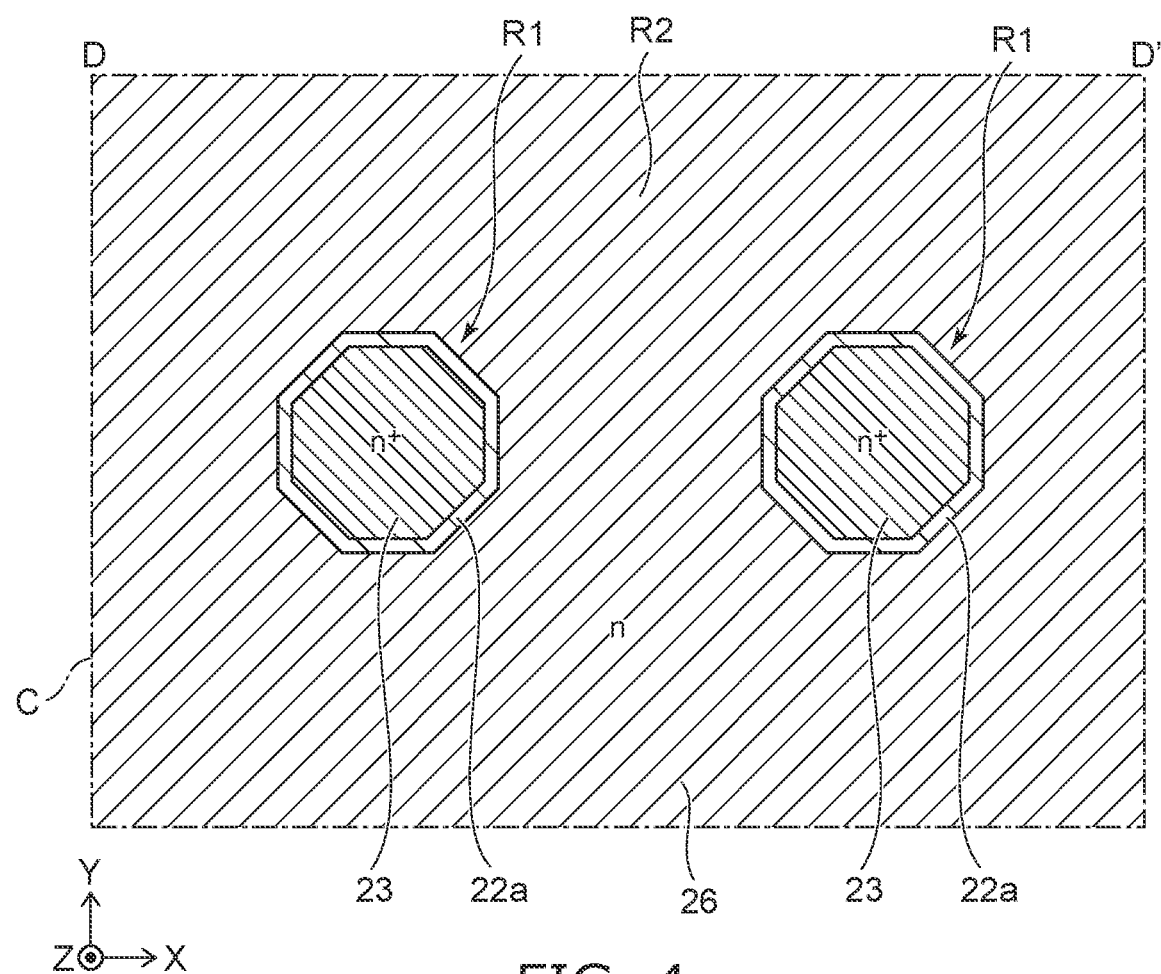
FIG. 4 is a cross-sectional view corresponding to a region C of FIG. 1 and shows a position of line D-D' of FIG. 3A.

FIG. 4 is a cross-sectional view corresponding to region C of FIG. 1 and shows the position of line D-D' of FIG. 3A.

Figure 5:
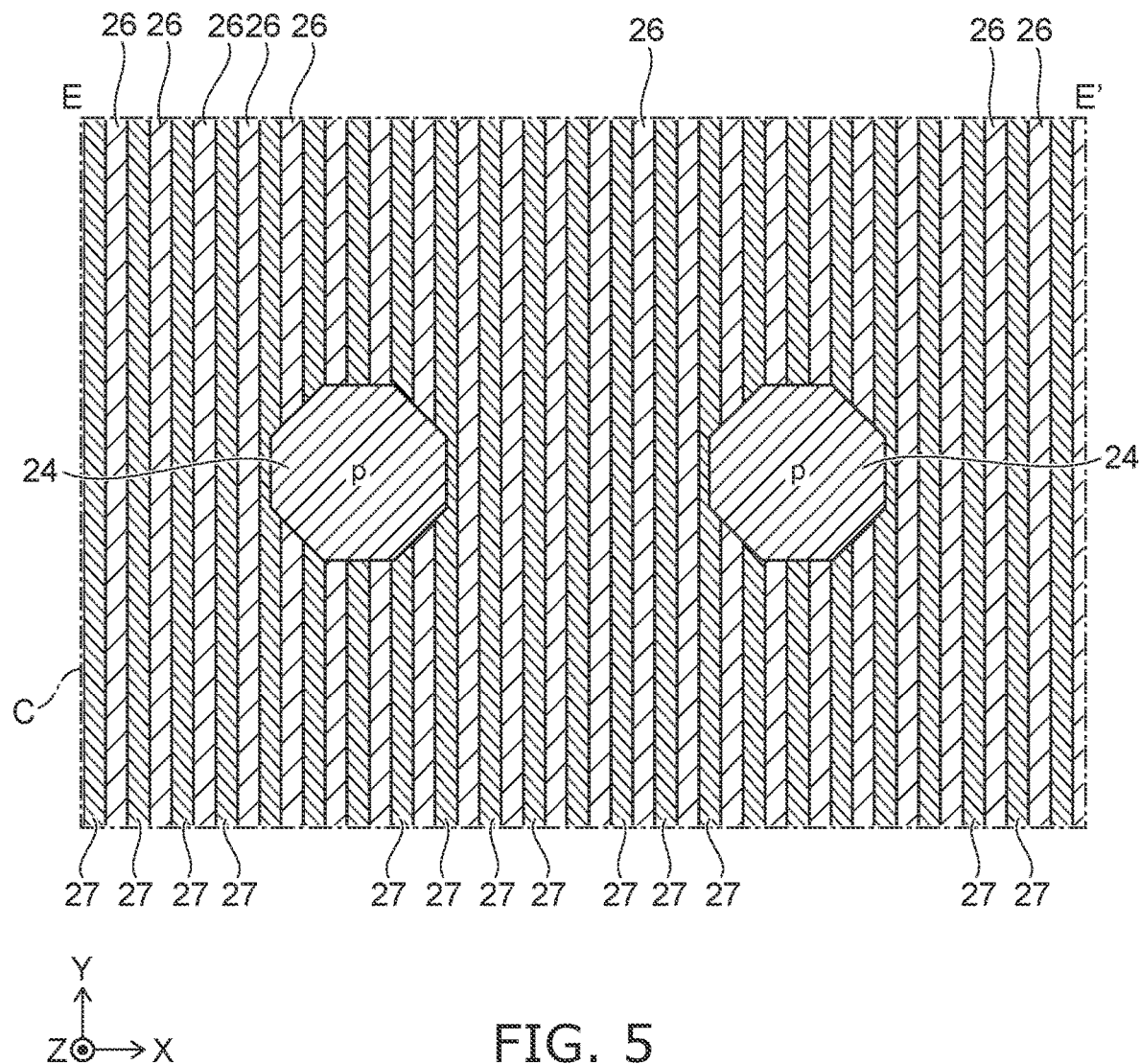
FIG. 5 is a cross-sectional view corresponding to the region C of FIG. 1 and shows a position of line E-E' of FIG. 3A.

FIG. 5 is a cross-sectional view corresponding to region C of FIG. 1 and shows the position of line E-E' of FIG. 3A.

Figure 6:
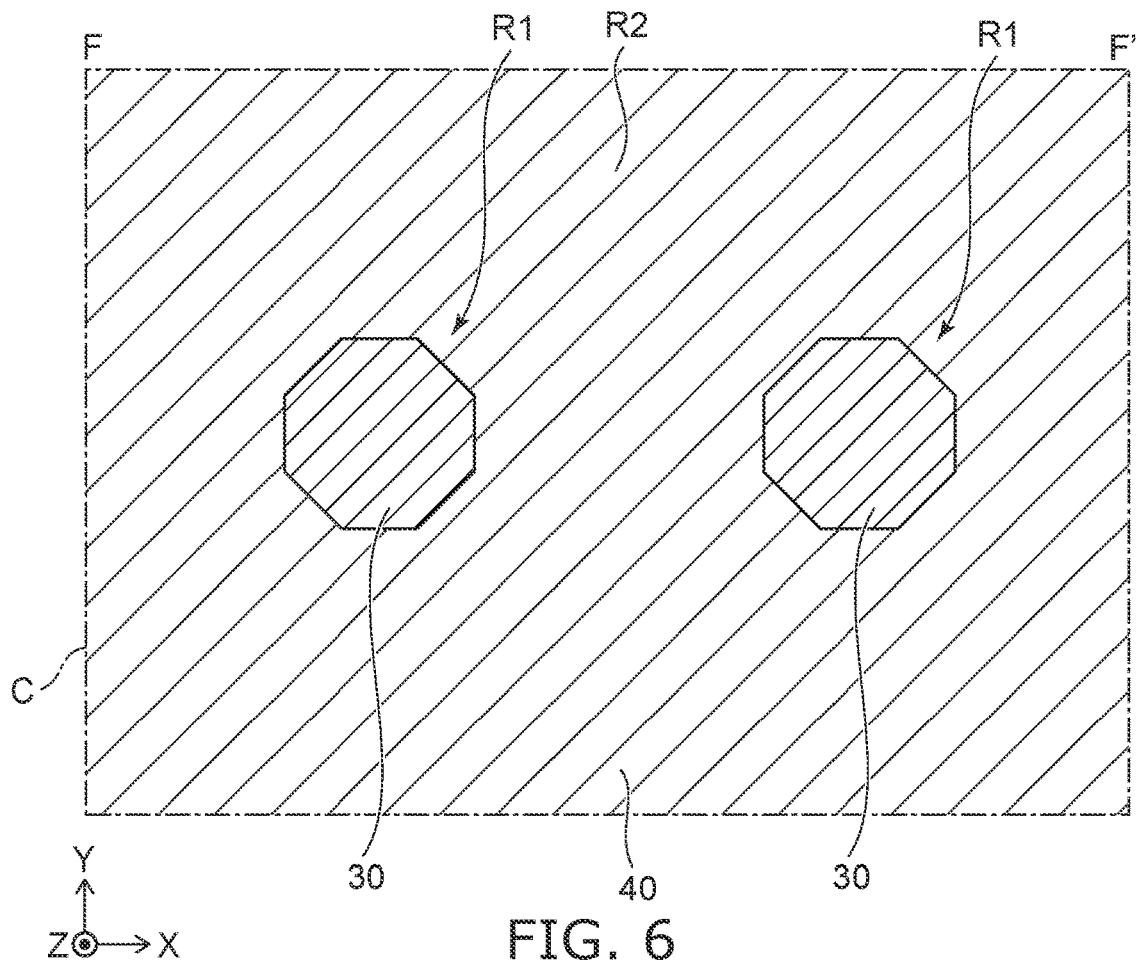
FIG. 6 is a cross-sectional view corresponding to the region C of FIG. 1 and shows a position of line F-F' of FIG. 3A.

FIG. 6 is a cross-sectional view corresponding to region C of FIG. 1 and shows the position of line F-F' of FIG. 3A.

Figure 7:
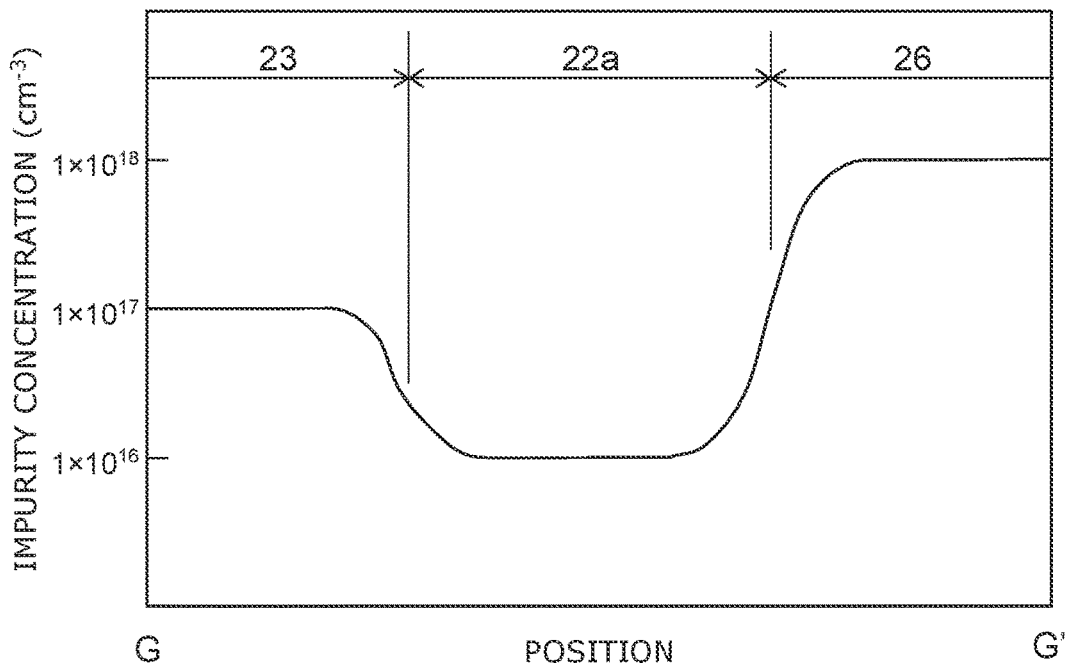
FIG. 7 is a graph showing an impurity concentration profile, in which the horizontal axis is a position along line G-G' of FIG. 3B, and the vertical axis is the impurity concentration.

FIG. 7 is a graph showing an impurity concentration profile, in which the horizontal axis is the position along line G-G' of FIG. 3B, and the vertical axis is the impurity concentration.

The drawings are schematic and are enhanced or simplified as appropriate. The dimensional ratios and numbers of components do not always match between the drawings.

As shown in FIGS. 1 and 2, a cell part Rc that carries current, a boundary part Ri that surrounds the cell part Rc, and a termination part Rt that surrounds the boundary part Ri are set in a semiconductor device 1 according to the embodiment. The semiconductor device 1 is formed of one chip. The cell part Rc is rectangular when viewed from above. The termination part Rt is a frame-shaped part forming the outer edge of the chip. The boundary part Ri is a frame-shaped part located between the cell part Rc and the termination part Rt.

P-i-n diode regions R1 and a JBS (junction barrier Schottky) region R2 are set in the cell part Rc. The multiple p-i-n diode regions R1 are arranged in a staggered configuration inside the JBS region R2 when viewed from above. For example, each p-i-n diode region R1 has an octagonal island shape. The arrangement of the multiple p-i-n diode regions R1 is not limited to a staggered configuration; and the shape of each p-i-n diode region R1 is not limited to octagonal.

An XYZ orthogonal coordinate system is employed for convenience of description in the specification hereinbelow. The direction of the shortest arrangement period of the p-i-n diode region R1 is taken as an "X-direction"; the direction from a cathode electrode 10 toward an anode electrode 50 described below is taken as a "Z-direction"; and a direction orthogonal to the X-direction and the Z-direction is taken as a "Y-direction". Among the Z-directions, the direction that is from the cathode electrode 10 toward the anode electrode 50 also is called "up", and the opposite direction also is called "down"; however, these expressions are for convenience and are independent of the direction of gravity.

As shown in FIGS. 1 to 6, the semiconductor device 1 includes the cathode electrode 10, a semiconductor part 20, a contact electrode 30, a Schottky electrode 40, the anode electrode 50, and an insulating film 60. The semiconductor part 20 is located on the cathode electrode 10. The contact electrode 30 is located in the cell part Rc on the semiconductor part 20. The Schottky electrode 40 and the anode electrode 50 are located in the cell part Rc and the boundary part Ri on the semiconductor part 20. The insulating film 60 is located in the boundary part Ri and the termination part Rt on the semiconductor part 20. The insulating film 60 is located between the semiconductor part 20 and the Schottky electrode 40 in the boundary part Ri. For example, the insulating film 60 is formed of silicon oxide ($SiO_2$). The Schottky electrode 40 and the anode electrode 50 are not illustrated in FIG. 1.

The semiconductor part 20 includes, for example, silicon carbide (SiC); and the conductivity type is set to an n-type or a p-type by introducing an impurity to each portion. In the specification, the "$n^+$-type" indicates a higher impurity concentration than the "n-type"; and the "$n^-$-type" indicates a lower impurity concentration than the "n-type". This is similar for the p-type as well. In the specification, the "impurity concentration" refers to the effective concentration contributing to the conduction of the semiconductor, and refers to the concentration excluding the cancelled portion when one portion includes both an impurity that forms acceptors and an impurity that forms donors.

The semiconductor part 20 includes an $n^+$-type drain layer 21, an $n^-$-type drift layer 22, an $n^+$-type layer 23, a p-type layer 24, a $p^+$-type layer 25, an n-type layer 26, a p-type layer 27, and a $p^-$-type RESURF layer 28. Among these layers, the $n^+$-type drain layer 21 and the $n^-$-type drift layer 22 are located in both the p-i-n diode region R1 and the JBS region R2. The $n^+$-type layer 23, the p-type layer 24, and the $p^+$-type layer 25 are located in each p-i-n diode region R1. In other words, in the semiconductor device 1, pluralities of the $n^+$-type layer 23, the p-type layer 24, and the $p^+$-type layer 25 are included, and each has, for example, an octagonal island shape when viewed from above. The n-type layer 26 and the p-type layer 27 are located in the JBS region R2. The $p^-$-type RESURF layer 28 is located in the termination part Rt.

The $n^+$-type drain layer 21 is located on the entire cathode electrode 10 and contacts the cathode electrode 10. The conductivity type of the $n^+$-type drain layer 21 is the $n^+$-type. The $n^-$-type drift layer 22 is located on the entire $n^+$-type drain layer 21 and contacts the $n^+$-type drain layer 21. The conductivity type of the $n^-$-type drift layer 22 is the $n^-$-type. In other words, the impurity concentration of the $n^-$-type drift layer 22 is less than the impurity concentration of the $n^+$-type drain layer 21.

The $n^+$-type layer 23 is located in the p-i-n diode region R1 on the $n^-$-type drift layer 22. The $n^+$-type layer 23 contacts the $n^-$-type drift layer 22. The conductivity type of the $n^+$-type layer 23 is the $n^+$-type; and the impurity concentration of the $n^+$-type layer 23 is greater than the impurity concentration of the $n^-$-type drift layer 22.

The p-type layer 24 is located in the p-i-n diode region R1 on the $n^+$-type layer 23. The outer edge of each p-type layer 24 is slightly larger than the outer edge of each $n^+$-type layer 23 when viewed from above. In other words, the outer perimeter portion of the p-type layer 24 is located on the $n^-$-type drift layer 22; and the portion of the p-type layer 24 other than the outer perimeter portion is located on the $n^+$-type layer 23. The p-type layer 24 contacts the $n^+$-type layer 23 and the $n^-$-type drift layer 22. The upper surface of the p-type layer 24 is exposed at the upper surface of the semiconductor part 20. The conductivity type of the p-type layer 24 is the p-type.

The $p^+$-type layer 25 is located on a portion of the p-type layer 24. The outer edge of the $p^+$-type layer 25 is slightly smaller than the outer edge of the p-type layer 24 when viewed from above. For example, the $p^+$-type layer 25 is located in a region directly above the $n^+$-type layer 23. The $p^+$-type layer 25 contacts the p-type layer 24. The upper surface of the $p^+$-type layer 25 is exposed at the upper surface of the semiconductor part 20. The impurity concentration of the $p^+$-type layer 25 is greater than the impurity concentration of the p-type layer 24. In the p-i-n diode region R1, a p-n diode is formed of the p-type part made of the p-type layer 24 and the $p^+$-type layer 25 and the n-type part made of the $n^+$-type drain layer 21, the $n^-$-type drift layer 22, and the $n^+$-type layer 23.

The n-type layer 26 is located in the JBS region R2 on the $n^-$-type drift layer 22. The n-type layer 26 contacts the $n^-$-type drift layer 22. The n-type layer 26 may be in contact with or separated from the p-type layer 24. The n-type layer 26 is separated from the $n^+$-type layer 23 with a portion 22a of the $n^-$-type drift layer 22 interposed. For example, the width of the portion 22a of the $n^-$-type drift layer 22 in the X-direction, i.e., the gap between the n-type layer 26 and the $n^+$-type layer 23, is about 0.3 to 0.7 μm. The conductivity type of the n-type layer 26 is the n-type; and the impurity concentration of the n-type layer 26 is greater than the impurity concentration of the $n^-$-type drift layer 22, less than the impurity concentration of the $n^+$-type layer 23, and less than the impurity concentration of the $n^+$-type drain layer 21.

For example, the impurity concentration of the n-type layer 26 is about $1 \times 10^{17}$ $cm^{-3}$; the impurity concentration of the $n^+$-type layer 23 is about $1 \times 10^{18}$ $cm^{-3}$; and the impurity concentration of the $n^-$-type drift layer 22 is about $1 \times 10^{16}$ $cm^{-3}$. Therefore, as shown in FIG. 7, the impurity concentration profile along line G-G' shown in FIG. 3B has a minimum value in the $n^-$-type drift layer 22.

The p-type layer 27 is located on a portion of the n-type layer 26. The conductivity type of the p-type layer 27 is the p-type. Multiple p-type layers 27 are included and have stripe shapes extending in the Y-direction. The multiple p-type layers 27 are periodically arranged in the X-direction. A portion of the n-type layer 26 is located between the two p-type layers 27 next to each other in the X-direction. The lower surface of the p-type layer 27 is positioned higher than the lower surface of the n-type layer 26. The upper surface of the p-type layer 27 is exposed at the upper surface of the semiconductor part 20. The upper surface of the portion of the n-type layer 26 located between the p-type layers 27 also is exposed at the upper surface of the semiconductor part 20. The upper surfaces of the p-type layers 27 and the upper surface of the portion of the n-type layer 26 located between the p-type layers 27 are positioned in the same plane.

In an example, multiple p-type layers 27 consecutively arranged along the X-direction are included in one group, and the Y-direction end portions of the multiple p-type layers 27 belonging to each group contact a common p-type layer 24. Namely, the multiple p-type layers 27 that belong to one group are located between two p-type layers 24 next to each other in the Y-direction. Also, the multiple p-type layers 27 that belong to each group are located between two p-type layers 24 next to each other in the X-direction.

The p⁻-type RESURF layer 28 is located in the termination part Rt on the n⁻-type drift layer 22. The p⁻-type RESURF layer 28 contacts the n⁻-type drift layer 22 and the p-type layer 24. The conductivity type of the p⁻-type RESURF layer 28 is the p⁻-type; and the impurity concentration of the p⁻-type RESURF layer 28 is less than the impurity concentration of the p-type layer 24.

The contact electrode 30 is located in the p-i-n diode region R1 on the semiconductor part 20. Namely, in the semiconductor device 1, for example, the multiple contact electrodes 30 are arranged in a staggered configuration. For example, each contact electrode 30 is octagonal when viewed from above. The contact electrode 30 is located on the p⁺-type layer 25 and contacts the p⁺-type layer 25. Thereby, the contact electrode 30 has an ohmic connection with the p⁺-type layer 25.

The Schottky electrode 40 is located in both the p-i-n diode region R1 and the JBS region R2 on the semiconductor part 20. The Schottky electrode 40 covers the multiple contact electrodes 30 and is connected with the multiple contact electrodes 30. In the JBS region R2, the Schottky electrode 40 is located on the n-type layer 26 and on the p-type layer 27 and contacts the n-type layer 26 and the p-type layer 27. The Schottky electrode 40 forms a Schottky barrier diode together with the n-type layer 26. The Schottky electrode 40 has an ohmic connection with the p-type layer 27.

The anode electrode 50 is located on the Schottky electrode 40 in the cell part Rc and the boundary part Ri. The anode electrode 50 contacts the Schottky electrode 40 and is connected to the Schottky electrode 40.

Operations of the semiconductor device 1 according to the embodiment will now be described.

Figure 8:
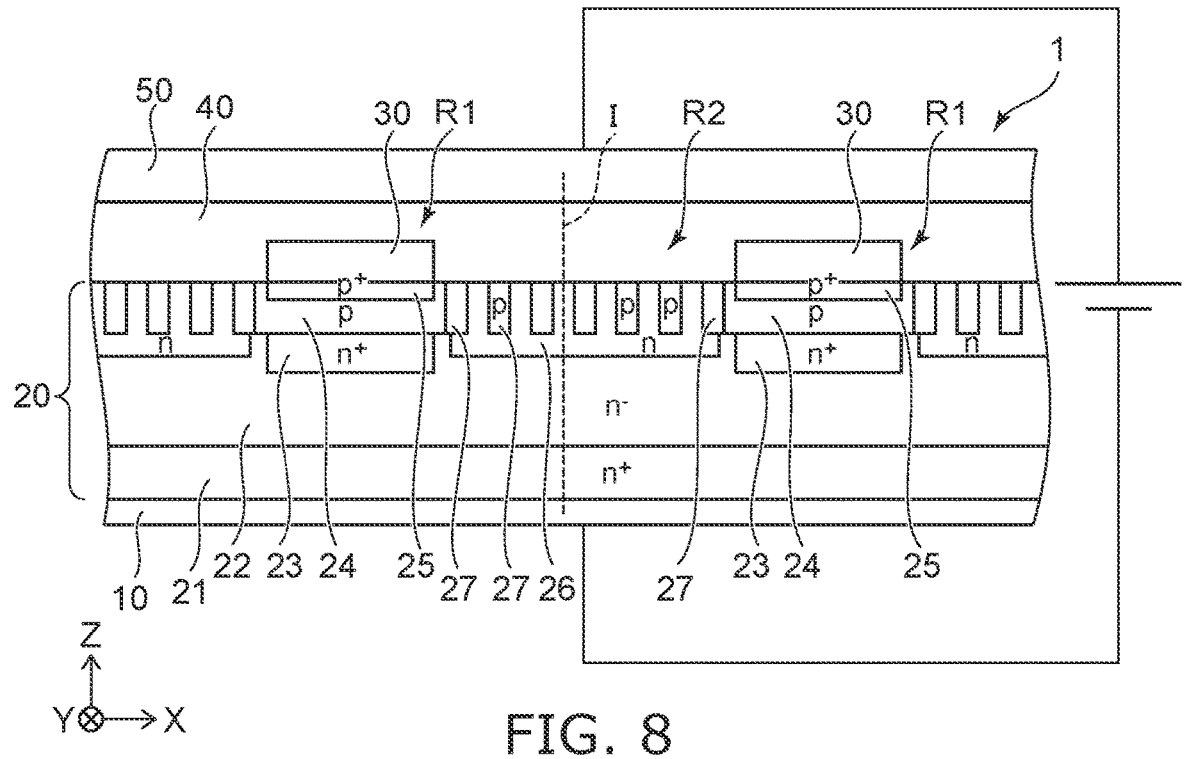
FIG. 8 is a schematic cross-sectional view showing a normal operation of the semiconductor device according to the embodiment when forward-biased.

FIG. 8 is a schematic cross-sectional view showing a normal operation of the semiconductor device according to the embodiment when forward-biased.

Figure 9:
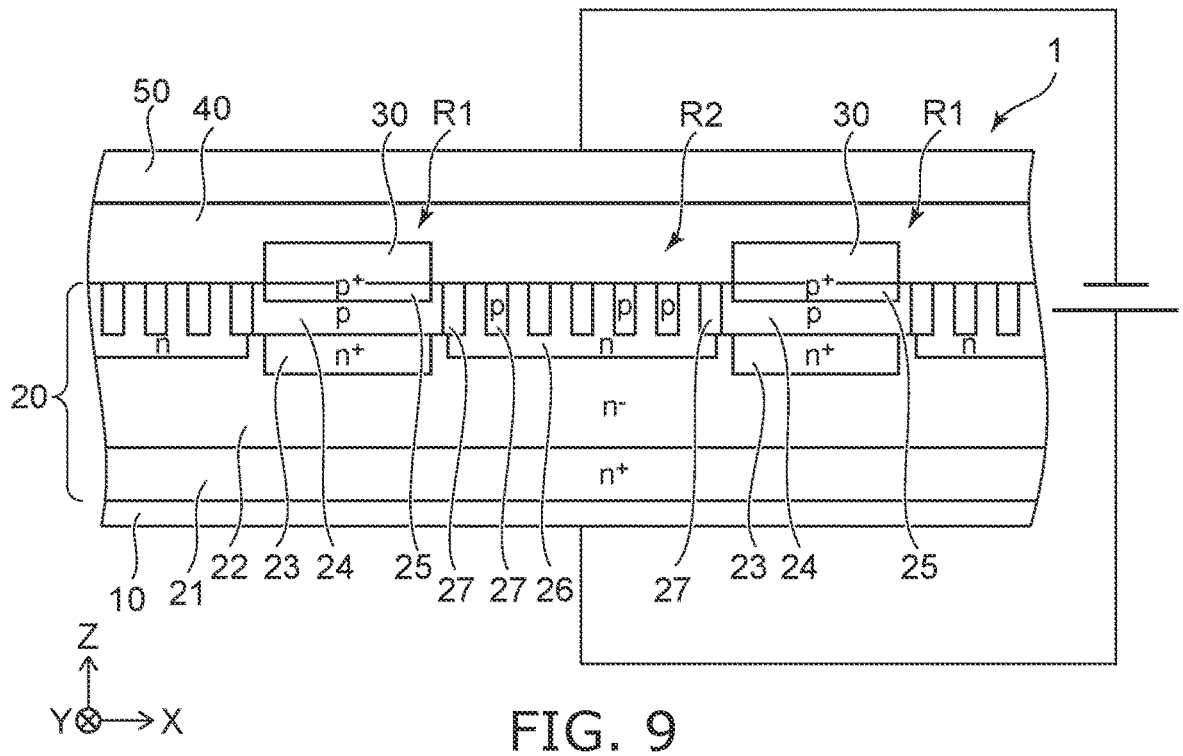
FIG. 9 is a schematic cross-sectional view showing a normal operation of the semiconductor device according to the embodiment when reverse-biased.

FIG. 9 is a schematic cross-sectional view showing a normal operation of the semiconductor device according to the embodiment when reverse-biased.

Figure 10:
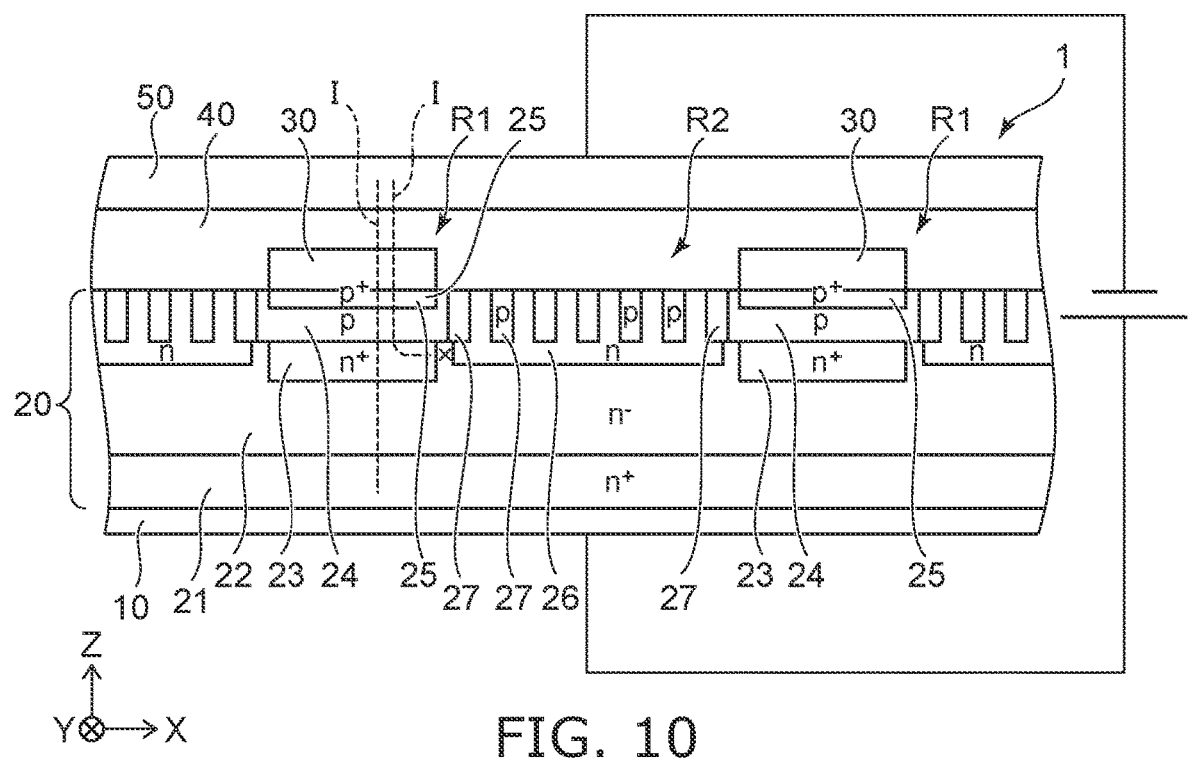
FIG. 10 is a schematic cross-sectional view showing when a reverse surge current flows in the semiconductor device according to the embodiment.

FIG. 10 is a schematic cross-sectional view showing when a reverse surge current flows in the semiconductor device according to the embodiment.

In FIGS. 8 and 10, the path of a current I is shown by a broken line.

As shown in FIG. 8, when the semiconductor device 1 is forward-biased, that is, when a voltage is applied so that the anode electrode 50 is positive and the cathode electrode 10 is negative, the forward current I flows in the Schottky barrier diode made of the Schottky electrode 40 and the n-type layer 26 in the JBS region R2. Thereby, the forward current I flows in the n-type layer 26 of the JBS region R2. At this time, the resistance (the on-resistance) of the forward current can be reduced because the impurity concentration of the n-type layer 26 is greater than the impurity concentration of the n⁻-type drift layer 22.

As shown in FIG. 9, when the semiconductor device 1 is reversed-biased, that is, when a voltage is applied so that the anode electrode 50 is negative and the cathode electrode 10 is positive, a depletion layer spreads inside the semiconductor part 20 with the interface between the Schottky electrode 40 and the n-type layer 26, the interface between the p-type layer 27 and the n-type layer 26, and the interface between the p-type layer 24 and the n⁺-type layer 23 as starting points. The current is blocked thereby.

At this time, because the p-type layer 27 is located in the JBS region R2, the position of the maximum electric field strength can be shifted into the semiconductor part 20 from the interface between the Schottky electrode 40 and the n-type layer 26. Because the interface between the Schottky electrode 40 and the n-type layer 26 has many defects, the leakage current when reverse-biased can be reduced by reducing the electric field strength at the interface.

A large surge current may instantaneously flow in the semiconductor device 1 when the power supply connected to the semiconductor device 1 is switched on or off, when the load connected to the semiconductor device 1 fluctuates, etc. In such a case, as shown in FIG. 10, breakdown of the n⁺-type layer 23 of the p-i-n diode region R1 occurs, and a surge current flows in the p-n diode made of the p-type layer 24 and the n⁺-type layer 23. Thereby, the greater part of the surge current can flow in the p-i-n diode region R1; and the JBS region R2 can be protected. As a result, thermal breakdown of the Schottky barrier diode made of the Schottky electrode 40 and the n-type layer 26 due to the surge current can be suppressed.

In the semiconductor device 1, the flow of a surge current between the n⁺-type layer 23 and the n-type layer 26 can be suppressed because the n-type layer 26 is separated from the n⁺-type layer 23. Thereby, leakage of the surge current from the p-i-n diode region R1 into the JBS region R2 can be suppressed when the p-i-n diode region R1 carries the surge current; and the Schottky barrier diode can be more reliably protected from the surge current.

Effects of the embodiment will now be described.

In the semiconductor device 1 as described above, the on-resistance can be reduced by providing the n-type layer 26 on the n⁻-type drift layer 22 in the JBS region R2. Also, by separating the n-type layer 26 from the n⁺-type layer 23, the flow of the surge current into the Schottky barrier diode can be suppressed, and thermal breakdown of the Schottky barrier diode can be suppressed.

According to the embodiments described above, a semiconductor device can be realized in which the breakdown voltage for surge current can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
a first electrode;
a first semiconductor layer connected to the first electrode, the first semiconductor layer being of a first conductivity type;
a second semiconductor layer located in a first region on the first semiconductor layer, the second semiconductor layer being of the first conductivity type, an impurity concentration of the second semiconductor layer being greater than an impurity concentration of the first semiconductor layer;

a third semiconductor layer located on the second semiconductor layer, the third semiconductor layer being of a second conductivity type;

a fourth semiconductor layer located in a second region on the first semiconductor layer, the fourth semiconductor layer being separated from the second semiconductor layer with a portion of the first semiconductor layer interposed, the fourth semiconductor layer being of the first conductivity type, an impurity concentration of the fourth semiconductor layer being greater than the impurity concentration of the first semiconductor layer and less than the impurity concentration of the second semiconductor layer;

a fifth semiconductor layer located on a portion of the fourth semiconductor layer, the fifth semiconductor layer being of the second conductivity type; and a second electrode connected to the third, fourth, and fifth semiconductor layers.

2. The device according to claim 1, wherein
the third semiconductor layer is island-shaped when viewed from above, and
the fifth semiconductor layer is stripe-shaped when viewed from above.

3. The device according to claim 1, wherein
the third semiconductor layer is octagonal island-shaped when viewed from above.

4. The device according to claim 1, wherein
a plurality of the third semiconductor layers is provided, and
the plurality of third semiconductor layers is arranged in a staggered configuration when viewed from above.

5. The device according to claim 1, wherein
an outer edge of the third semiconductor layer is larger than an outer edge of the second semiconductor layer when viewed from above.

6. The device according to claim 1, wherein
the second semiconductor layer is in contact with the third semiconductor layer.

7. The device according to claim 1, wherein
the second semiconductor layer is separated from the fourth semiconductor layer with the first semiconductor layer interposed.

8. The device according to claim 7, wherein
a gap between the second semiconductor layer and the fourth semiconductor layer is not less than 0.3 μm and not more than 0.7 μm.

9. The device according to claim 1, further comprising:
a sixth semiconductor layer located between the first electrode and the first semiconductor layer,
the sixth semiconductor layer being of the first conductivity type,
an impurity concentration of the sixth semiconductor layer being greater than the impurity concentration of the first semiconductor layer.

10. The device according to claim 9, wherein
the impurity concentration of the sixth semiconductor layer is greater than the impurity concentration of the fourth semiconductor layer.

11. The device according to claim 1, wherein
the second electrode includes:
a third electrode contacting the third semiconductor layer; and
a fourth electrode contacting the fourth and fifth semiconductor layers.

12. The device according to claim 1, wherein
the first semiconductor layer, the second semiconductor layer, the third semiconductor layer, the fourth semiconductor layer, and the fifth semiconductor layer include silicon and carbon.

\* \* \* \* \*